United States Patent
Ono et al.

(10) Patent No.: US 12,074,580 B2
(45) Date of Patent: Aug. 27, 2024

(54) SIGNAL GENERATION APPARATUS, LEVEL CORRECTION VALUE CALCULATION SYSTEM, AND LEVEL CORRECTION VALUE CALCULATION METHOD

(71) Applicant: ANRITSU CORPORATION, Kanagawa (JP)

(72) Inventors: Hirofumi Ono, Kanagawa (JP); Koji Yamashita, Kanagawa (JP); Shinichi Ito, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 13 days.

(21) Appl. No.: 18/069,401

(22) Filed: Dec. 21, 2022

(65) Prior Publication Data

US 2023/0308070 A1 Sep. 28, 2023

(30) Foreign Application Priority Data

Feb. 7, 2022 (JP) .................... 2022-017216

(51) Int. Cl.
*H03G 1/00* (2006.01)
*H03H 7/25* (2006.01)

(52) U.S. Cl.
CPC ............ *H03H 7/25* (2013.01); *H03G 1/0088* (2013.01)

(58) Field of Classification Search
CPC ... H03H 7/25; H03G 1/0088; H03G 2201/106
See application file for complete search history.

(56) References Cited

U.S. PATENT DOCUMENTS

| 2013/0090077 | A1* | 4/2013 | Rozenblit | .......... | H03H 21/0001 |
| | | | | | 455/127.2 |
| 2015/0244051 | A1* | 8/2015 | Domino | ............. | H03H 17/0054 |
| | | | | | 333/81 R |
| 2016/0079959 | A1* | 3/2016 | Joish | ........................ | H03H 7/25 |
| | | | | | 327/308 |
| 2024/0007083 | A1* | 1/2024 | Clara | .................... | H03H 11/245 |

FOREIGN PATENT DOCUMENTS

JP 2008-205812 A 9/2008

* cited by examiner

*Primary Examiner* — Sibin Chen
(74) *Attorney, Agent, or Firm* — Pearne & Gordon LLP

(57) ABSTRACT

A signal generation unit 2, a DA converter 3, variable attenuators 40, 42, 44, and 46, a measurement unit 6 that detects a level of the signal attenuated by the variable attenuators 40, 42, 44, and 46 and passed through one or more semiconductor components, a switch 48 that switches between an Internal path through which the signal attenuated by the variable attenuator 40, 42, 44, and 46 is transmitted to the measurement unit 6 and an External path through which the signal attenuated by the variable attenuator 40, 42, 44, and 46 is output from an output terminal 10, and a control unit 7 that obtains a correction value of an attenuation amount of the variable attenuators 40, 42, and 44 with the Internal path and obtains a correction value of an attenuation amount of the variable attenuator 46 with the External path.

8 Claims, 4 Drawing Sheets

| Total Level | ATT | Gain | Measurement value | Step Error[n] |
|---|---|---|---|---|
| 0 | 0 | 0 | | Step Error[0]=0 (Reference value) |
| -1 | 0 | -1 | y[1] | Step Error[1]=Step Error[0]+(y[1]-x[1]) |
| -1 | 1 | 0 | x[1] | Step Error[2]=Step Error[1]+(x[1]-z[1]) |
| -1 | 2 | 1 | z[1] | |
| -3 | 2 | -1 | y[3] | Step Error[3]=Step Error[2]+(y[3]-x[3]) |
| -3 | 3 | 0 | x[3] | Step Error[4]=Step Error[3]+(x[3]-z[3]) |
| -3 | 4 | 1 | z[3] | |
| ... | ... | ... | ... | ... |
| -29 | 28 | -1 | y[29] | Step Error[29]=Step Error[28]+(y[29]-x[29]) |
| -29 | 29 | 0 | x[29] | Step Error[30]=Step Error[29]+(x[29]-z[29]) |
| -29 | 30 | 1 | z[29] | |

FIG. 2

SIGNAL GENERATION APPARATUS, LEVEL CORRECTION VALUE CALCULATION SYSTEM, AND LEVEL CORRECTION VALUE CALCULATION METHOD

TECHNICAL FIELD

The present invention relates to a signal generation apparatus that generates an analog signal in a desired frequency band.

BACKGROUND ART

As a signal generation apparatus that generates an analog signal in a desired frequency band, for example, a signal generation apparatus that converts a digital signal generated by a signal generator into an analog signal with a DA converter, and generates the analog signal in the desired frequency band is known.

Such a signal generation apparatus is incorporated in, for example, a mobile terminal test apparatus or the like that tests a mobile communication terminal, and generates and outputs a test signal.

Patent Document 1 describes a signal generation apparatus including quadrature modulation means for modulating a local signal according to an output signal of a baseband signal generation unit, and a variable ATT for attenuating a level of a signal from the quadrature modulation means in steps, in which a first correction value for correcting a frequency response characteristic to an input of the variable ATT from the quadrature modulation means and a second correction value for correcting an attenuation amount error at each step of the variable ATT are stored, and correction is performed by varying a size of an output signal with respect to a baseband signal generation unit based on the first correction value and the second correction value corresponding to a frequency during a modulation signal output.

RELATED ART DOCUMENT

[Patent Document]
[Patent Document 1] JP-A-2008-205812

DISCLOSURE OF THE INVENTION

Problem that the Invention is to Solve

In this manner, in a case of obtaining a correction value of an attenuation amount at each step of a variable attenuator, measurement is performed by changing a gain of the signal generation unit and the attenuation amount of the variable attenuator. Meanwhile, if the gain of the signal generation unit is greatly changed, non-linearity of a semiconductor component on a path from the signal generation unit to a measurement unit affects, and the correction value with high accuracy cannot be obtained.

Accordingly, an object of the present invention is to provide a signal generation apparatus capable of obtaining a correction value for a variable attenuator with high accuracy by suppressing an influence of non-linearity of a semiconductor component on a path from a signal generation unit to a measurement unit.

Means for Solving the Problem

According to the present invention, there is provided a signal generation apparatus including: a signal generation unit that generates a predetermined digital signal; a DA converter that converts the digital signal generated by the signal generation unit into an analog signal of a predetermined radio frequency; a plurality of variable attenuators that attenuate the analog signal converted by the DA converter; a measurement unit that detects a level of the signal attenuated by the variable attenuator and passed through one or more semiconductor components; a switch that switches between an Internal path through which the signal attenuated by the variable attenuator is transmitted to the measurement unit and an External path through which the signal attenuated by the variable attenuator is output from an output terminal; and a control unit that obtains a value of a step error, which is a correction value of an attenuation amount of the variable attenuator in each of a plurality of steps obtained by dividing a maximum value of the attenuation amount of the variable attenuator by a variation amount, which is a predetermined attenuation amount, in which the control unit calculates the value of the step error of a first variable attenuator, which is less affected by a change in impedance due to switching of the switch, among the plurality of variable attenuators, with the Internal path, and calculates the value of the step error of a second variable attenuator, which is greatly affected by the change in impedance due to switching of the switch, with the External path.

With this configuration, the step error value of the first variable attenuator, which is less affected by the change in impedance due to switching of the switch, is calculated by using the Internal path, and the step error value of the second variable attenuator, which is greatly affected by the change in impedance due to switching of the switch, is calculated by using the External path, so that the correction value of the variable attenuator can be obtained with high accuracy by suppressing the influence of the change in impedance due to switching of the switch and an influence of non-linearity of a semiconductor component on a path from the signal generation unit to the measurement unit.

In addition, in the signal generation apparatus according to the present invention, the control unit calculates the value of the step error with the Internal path, which is a correction value of the first variable attenuator, by performing a first initial step error calculation process at first, and then repeatedly performing a first step error calculation process and a second step error calculation process alternately, the first initial step error calculation process is a process of setting a measurement value of the measurement unit when a gain of the signal generation unit is set to zero and an attenuation amount of the first variable attenuator is set to zero, as the value of the step error at zero attenuation amount, the first step error calculation process is a process of setting a measurement value of the measurement unit when the gain of the signal generation unit is set to a negative variation amount and the attenuation amount of the first variable attenuator is set to the attenuation amount at a time of the previous measurement, as a first reference value, setting a value obtained by subtracting a measurement value of the measurement unit when the gain of the signal generation unit is set to zero and the attenuation amount of the first variable attenuator is set to an attenuation amount obtained by adding the variation amount to the attenuation amount at the time of the previous measurement from the first reference value, as a first error value, and setting a value obtained by adding the first error value and the value of the step error of the previous step, as the value of the step error of the next step, and the second step error calculation process is a process of setting a measurement value of the measurement unit when the gain of the signal generation unit is set to a positive variation amount and the attenuation amount of the first variable attenuator is set to an attenuation amount obtained by adding the variation amount to the attenuation amount at the time of the previous measurement, as a second reference value, setting a value obtained by subtracting the second reference value from the previous measurement value, as a second error value, and setting a value obtained by adding the second error value and the value of the step error of the previous step, as the value of the step error of the next step.

With this configuration, the correction value of the first variable attenuator with high accuracy can be obtained by calculating the correction value of the variable attenuator for each predetermined variation amount and suppressing an influence of non-linearity of a semiconductor component on a path from the signal generation unit to the measurement unit.

In addition, in the signal generation apparatus according to the present invention, the control unit calculates the value of the step error with the External path, which is a correction value of the second variable attenuator, by performing a second initial step error calculation process at first, and then repeatedly performing a third step error calculation process, the second initial step error calculation process is a process of setting a measurement value when a gain of the signal generation unit is set to zero and an attenuation amount of the second variable attenuator is set to zero, as the value of the step error at zero attenuation amount, and the third step error calculation process is a process of setting a value obtained by subtracting the variation amount from the measurement value at a time of the previous measurement, as a third reference value, setting a value obtained by subtracting a measurement value when the attenuation amount of the second variable attenuator is set to an attenuation amount obtained by adding the variation amount to the attenuation amount at the time of the previous measurement from the third reference value, as a third error value, and setting a value obtained by adding the third error value and the value of the step error of the previous step, as the value of the step error of the next step.

With this configuration, the correction value of the second variable attenuator with high accuracy can be obtained by calculating the correction value of the variable attenuator for each predetermined variation amount and suppressing an influence of non-linearity of a semiconductor component on a path from the signal generation unit to an output terminal.

In addition, in the signal generation apparatus according to the present invention, the control unit calculates the value of the step error with the External path, which is a correction value of the second variable attenuator, by performing a second initial step error calculation process at first, and then repeatedly performing a third step error calculation process, the second initial step error calculation process is a process of setting a measurement value when a gain of the signal generation unit is set to zero and an attenuation amount of the second variable attenuator is set to zero, as the value of the step error at zero attenuation amount, and the third step error calculation process is a process of setting a value obtained by subtracting the variation amount from the measurement value at a time of the previous measurement, as a third reference value, setting a value obtained by subtracting a measurement value when the attenuation amount of the second variable attenuator is set to an attenuation amount obtained by adding the variation amount to the attenuation amount at the time of the previous measurement from the third reference value, as a third error value, and setting a value obtained by adding the third error value and the value of the step error of the previous step, as the value of the step error of the next step.

In addition, according to the present invention, there is provided a level correction value calculation system including: a signal generation apparatus including a signal generation unit that generates a predetermined digital signal, a DA converter that converts the digital signal generated by the signal generation unit into an analog signal of a predetermined radio frequency, a plurality of variable attenuators that attenuate the analog signal converted by the DA converter, a measurement unit that detects a level of the signal attenuated by the variable attenuator and passed through one or more semiconductor components, a switch that switches between an Internal path through which the signal attenuated by the variable attenuator is transmitted to the measurement unit and an External path through which the signal attenuated by the variable attenuator is output from an output terminal, and a control unit that obtains a value of a step error, which is a correction value of an attenuation amount of the variable attenuator in each of a plurality of steps obtained by dividing a maximum value of the attenuation amount of the variable attenuator by a variation amount, which is a predetermined attenuation amount, the control unit calculating the value of the step error of a first variable attenuator, which is less affected by a change in impedance due to switching of the switch, among the plurality of variable attenuators, with the Internal path, and calculating the value of the step error of a second variable attenuator, which is greatly affected by the change in impedance due to switching of the switch, with the External path; and a measurement apparatus that detects a level of the signal output from the signal generation apparatus and transmits the level to the control unit.

With this configuration, the correction value of the variable attenuator with high accuracy can be obtained by calculating the correction value of the variable attenuator for each predetermined variation amount and suppressing the influence of non-linearity of the semiconductor component on the path from the signal generation unit to the output terminal.

In addition, according to the present invention, there is provided a level correction value calculation method of a signal generation apparatus including a signal generation unit that generates a predetermined digital signal, a DA converter that converts the digital signal generated by the signal generation unit into an analog signal of a predetermined radio frequency, a plurality of variable attenuators that attenuate the analog signal converted by the DA converter, a measurement unit that detects a level of the signal attenuated by the variable attenuator and passed through one or more semiconductor components, a switch that switches between an Internal path through which the signal attenuated by the variable attenuator is transmitted to the measurement unit and an External path through which the signal attenuated by the variable attenuator is output from an output terminal, and a control unit that obtains a value of a step error, which is a correction value of an attenuation amount of the variable attenuator in each of a plurality of steps obtained by dividing a maximum value of the attenuation amount of the variable attenuator by a variation amount, which is a predetermined attenuation amount, the method including: calculating the value of the step error of a first variable attenuator, which is less affected by a change in impedance due to switching of the switch, among the plurality of variable attenuators, with the Internal path; and calculating the value of the step error of a second variable attenuator, which is greatly affected by the change in impedance due to switching of the switch, with the External path.

With this configuration, the value of the step error of the first variable attenuator, which is less affected by the change in impedance due to switching of the switch, is calculated by using the Internal path, and the value of the step error of the second variable attenuator, which is greatly affected by the change in impedance due to switching of the switch, is calculated by using the External path, so that the correction value of the variable attenuator can be obtained with high accuracy by suppressing the influence of the change in impedance due to switching of the switch and an influence of non-linearity of a semiconductor component on a path from the signal generation unit to the measurement unit.

Further, in the level correction value calculation method according to the present invention, the calculating with the Internal path includes calculating a correction value of the first variable attenuator by performing a first initial step error calculation step at first, and then repeatedly performing a first step error calculation step and a second step error calculation step alternately, the first initial step error calculation step is a step of setting a measurement value of the measurement unit when a gain of the signal generation unit is set to zero and an attenuation amount of the first variable attenuator is set to zero, as the value of the step error at zero attenuation amount, the first step error calculation step includes a step of setting a measurement value of the measurement unit when the gain of the signal generation unit is set to a negative variation amount and the attenuation amount of the first variable attenuator is set to the attenuation amount at a time of the previous measurement, as a first reference value, a step of setting a value obtained by subtracting a measurement value of the measurement unit when the gain of the signal generation unit is set to zero and the attenuation amount of the first variable attenuator is set to an attenuation amount obtained by adding the variation amount to the attenuation amount at the time of the previous measurement from the first reference value, as a first error value, and a step of setting a value obtained by adding the first error value and the value of the step error of the previous step, as the value of the step error of the next step, and the second step error calculation step includes a step of setting a measurement value of the measurement unit when the gain of the signal generation unit is set to a positive variation amount and the attenuation amount of the first variable attenuator is set to an attenuation amount obtained by adding the variation amount to the attenuation amount at the time of the previous measurement, as a second reference value, a step of setting a value obtained by subtracting the second reference value from the previous measurement value, as a second error value, and a step of setting a value obtained by adding the second error value and the value of the step error of the previous step, as the value of the step error of the next step.

With this configuration, the correction value of the first variable attenuator with high accuracy can be obtained by calculating the correction value of the variable attenuator for each predetermined variation amount and suppressing the influence of non-linearity of the semiconductor component on the path from the signal generation unit to the measurement unit.

Further, in the level correction value calculation method according to the present invention, the calculating with the External path includes calculating a correction value of the second variable attenuator by performing a second initial step error calculation step at first, and then repeatedly performing a third step error calculation step, the second initial step error calculation step is a step of setting a measurement value when a gain of the signal generation unit is set to zero and an attenuation amount of the second variable attenuator is set to zero, as the value of the step error at zero attenuation amount, and the third step error calculation step includes a step of setting a value obtained by subtracting the variation amount from the measurement value at a time of the previous measurement, as a third reference value, a step of setting a value obtained by subtracting a measurement value when the attenuation amount of the second variable attenuator is set to an attenuation amount obtained by adding the variation amount to the attenuation amount at the time of the previous measurement from the third reference value, as a third error value, and a step of setting a value obtained by adding the third error value and the value of the step error of the previous step, as the value of the step error of the next step.

With this configuration, the correction value of the second variable attenuator with high accuracy can be obtained by calculating the correction value of the variable attenuator for each predetermined variation amount and suppressing the influence of non-linearity of the semiconductor component on the path from the signal generation unit to the output terminal.

Advantage of the Invention

The present invention can provide a signal generation apparatus capable of obtaining a correction value of a variable attenuator with high accuracy by suppressing an influence of non-linearity of a semiconductor component on a path from a signal generation unit to a measurement unit.

BRIEF DESCRIPTION OF THE DRAWINGS

FIG. 2 is a diagram for explaining a method of calculating a step error value of the signal generation apparatus according to the embodiment of the present invention.

BEST MODE FOR CARRYING OUT THE INVENTION

Hereinafter, a signal generation apparatus according to an embodiment of the present invention will be described in detail with reference to the drawings.

Figure 1:
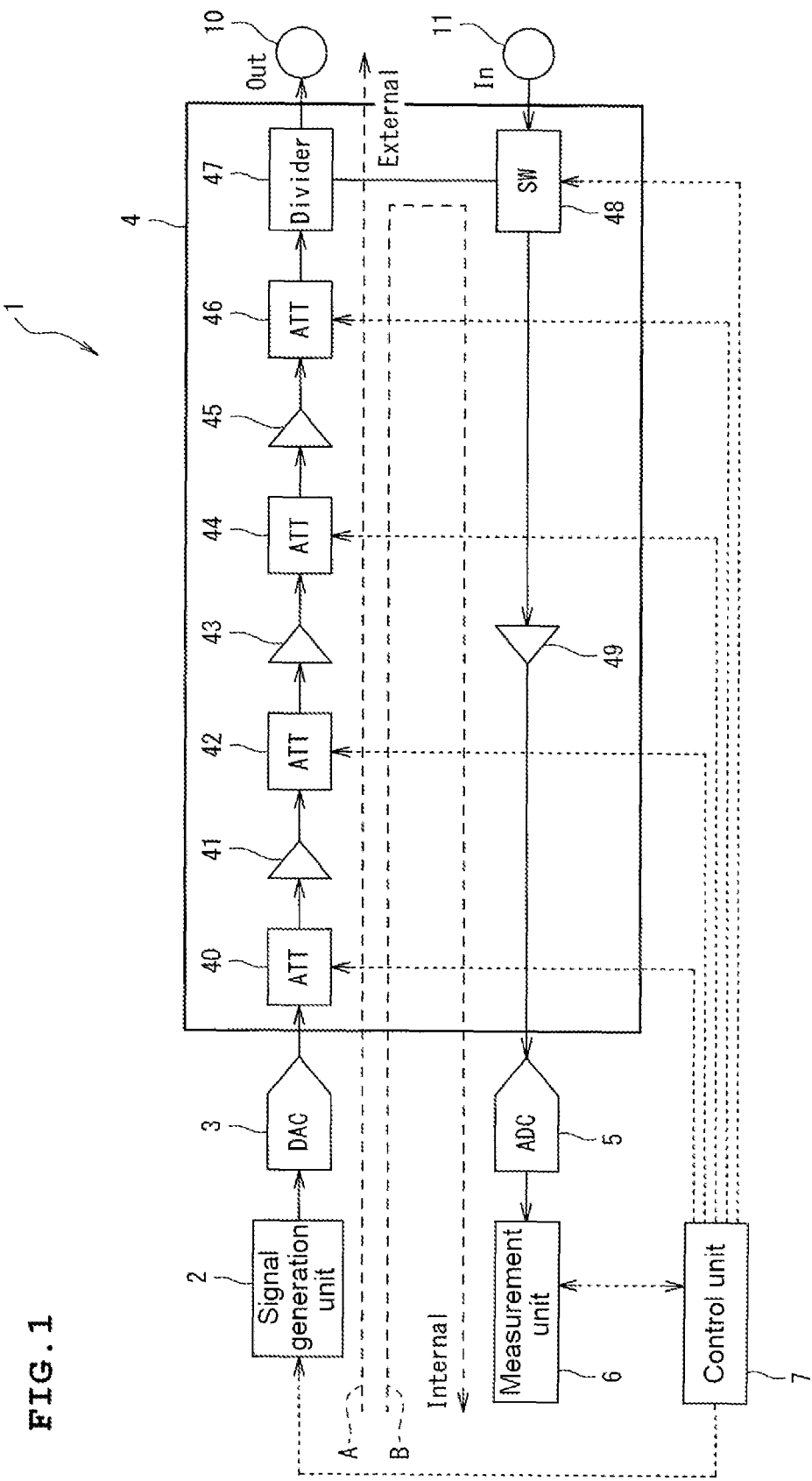
FIG. 1 is a block diagram of a signal generation apparatus according to an embodiment of the present invention.

In FIG. 1, a signal generation apparatus 1 according to the embodiment of the present invention is configured with a signal generation unit 2, a DA converter (digital to analog converter (DAC)) 3, an RF module 4, an AD converter (analog to digital converter (ADC)) 5, a measurement unit 6, and a control unit 7.

The signal generation unit 2 generates and outputs a predetermined digital signal. The signal generation unit 2 can adjust a digital gain of the output digital signal. The digital gain of the digital signal output from the signal generation unit 2 is adjusted under control of the control unit 7.

The DA converter 3 converts the digital signal generated by the signal generation unit 2 into an analog signal of a predetermined radio frequency.

The RF module 4 adjusts a level of the analog signal output from the DA converter 3, and outputs the analog signal from the output terminal 10.

The RF module 4 is configured with variable attenuators 40, 42, 44, and 46 that adjust a level of an input signal, amplifiers 41, 43, 45, and 49 that amplify the input signal, a divider 47 that distributes an analog signal output by a variable attenuator 46 to the output terminal 10 or a switch 48, and the switch 48 that selects any of the analog signal output by the divider 47 or the analog signal input to an input terminal 11 and output the signal to the amplifier 49.

The variable attenuators 40, 42, 44, and 46 change the attenuation amount under the control of the control unit 7. The switch 48 switches a signal to be output to the amplifier 49 under the control of the control unit 7.

The AD converter 5 converts the analog signal input to the input terminal 11 or the analog signal returned within the RF module 4 into a digital signal.

The measurement unit 6 measures a level and the like of the digital signal output from the AD converter 5. The measurement unit 6 performs measurement under the control of the control unit 7, and transmits the measurement result to the control unit 7.

The control unit 7 is configured by a computer apparatus, for example. This computer apparatus includes a central processing unit (CPU), a read only memory (ROM), a random access memory (RAM), a non-volatile storage medium such as a hard disk device, various types of input and output ports, a display device, an input device such as a pointing device or a keyboard device (each is not illustrated).

A program for causing the computer apparatus to function as the control unit 7 is stored in the ROM and the hard disk device of the computer apparatus. That is, the computer apparatus functions as the control unit 7 by the CPU executing the program stored in the ROM by using the RAM as a work region.

The signal generation apparatus 1 can cause the switch 48 to switch an External path through which a level of a signal generated by the signal generation unit 2 is adjusted in the RF module 4 and the signal is output from the output terminal 10, indicated by a dotted line A in FIG. 1, and an Internal path through which a signal generated by the signal generation unit 2 and level-adjusted by the RF module 4 is returned by the RF module 4 and input to the measurement unit 6 via the AD converter 5, indicated by a dotted line B in FIG. 1.

The variable attenuators 40, 42, 44, and 46 of the present embodiment have non-linear characteristics. It is necessary to correct this non-linearity, but if a gain of the signal generation unit 2 is greatly changed, the non-linearity of a semiconductor component on the path from the signal generation unit 2 to the measurement unit 6 will affect, the correction value with high accuracy cannot be obtained.

Therefore, in the present embodiment, the maximum value of the attenuation amount of the variable attenuators 40, 42, 44, and 46 is divided by a variation amount, which is a predetermined attenuation amount, and a step error value is calculated as an error when the attenuation amount is changed stepwise by the variation amount, and the attenuation amount is corrected.

For example, in a case where a settable attenuation amount of the variable attenuators 40, 42, 44, and 46 is zero to 30 dB and the minimum resolution is 1 dB, an error when the attenuation amount of the variable attenuators 40, 42, 44, and 46 is divided by 1 dB and the attenuation amount is changed stepwise by 1 dB is calculated as the step error value.

In addition, in the present embodiment, in the variable attenuator 46 close to the output terminal 10, an impedance change due to switching of the switch 48 for switching between the Internal path and the External path cannot be ignored. Therefore, in a case where the step error values of all the variable attenuators 40, 42, 44, and 46 are calculated with the Internal path, an error occurs in the step error value of the signal generation apparatus 1 as a whole.

Therefore, in the present embodiment, a step error value of a first variable attenuator, which is distant from the output terminal 10 and is less affected by a change in impedance due to switching of the switch 48, is calculated with the Internal path, and a step error value of a second variable attenuator, which is close to the output terminal 10 and greatly affected by the change in impedance due to switching of the switch 48, is calculated with the External path, so that the step error value of the signal generation apparatus 1 as a whole is brought closer to an expected value.

In the present embodiment, for example, the variable attenuators 40, 42, and 44 are the first variable attenuators, and the variable attenuator 46 is the second variable attenuator.

The control unit 7 sets the Internal path through which a signal generated by the signal generation unit 2 and level-adjusted by the RF module 4 is returned in the RF module 4, and changes a gain of the signal generated by the signal generation unit 2 and the attenuation amount of the variable attenuators 40, 42, and 44 to calculate the step error value.

The control unit 7 sets a measurement value of the measurement unit 6 when the gain of the signal generation unit 2 is set to zero and the attenuation amount of the variable attenuators 40, 42, and 44 is set to zero, as the step error value at zero attenuation amount (first initial step error calculation process).

For example, the control unit 7 sets a measurement value of the measurement unit 6 when the gain of the signal generation unit 2 is set to a negative variation amount and the attenuation amount of the variable attenuators 40, 42, and 44 is set to the attenuation amount at a time of the previous measurement, as a first reference value.

The control unit 7 sets a value obtained by subtracting a measurement value of the measurement unit 6 when the gain of the signal generation unit 2 is set to zero and the attenuation amount of the variable attenuators 40, 42, and 44 is set to an attenuation amount obtained by adding the variation amount to the attenuation amount at a time of the previous measurement from the first reference value, as a first error value.

The control unit 7 sets a value obtained by adding the first error value and the step error value of the previous step, as a step error value of the next step (first step error calculation process).

Next, the control unit 7 sets a measurement value of the measurement unit 6 when the gain of the signal generation unit 2 is set to a positive variation amount and the attenuation amount of the variable attenuators 40, 42, and 44 is set to an attenuation amount obtained by adding the variation amount to the attenuation amount at a time of the previous measurement, as a second reference value.

The control unit 7 sets a value obtained by subtracting the second reference value from the previous measurement value as a second error value. The control unit 7 sets a value obtained by adding the second error value and the step error value of the previous step, as a step error value of the next step (second step error calculation process).

Next, the control unit 7 sets a measurement value of the measurement unit 6 when the gain of the signal generation unit 2 is set to a negative variation amount and the attenuation amount of the variable attenuators 40, 42, and 44 is set to the attenuation amount at a time of the previous measurement as the first reference value, and repeats this process to calculate the step error value at each step.

FIG. 2 illustrates a calculation method in which in a case where a settable attenuation amount of the variable attenuators 40, 42, and 44 is zero to 30 dB and the minimum resolution is 1 dB, a step error value when the attenuation amount of the variable attenuators 40, 42, and 44 is divided by 1 dB and the attenuation amount is changed stepwise by 1 dB is calculated. The step error value is calculated for each of the variable attenuators 40, 42, and 44.

In FIG. 2, the control unit 7 sets a measurement value of the measurement unit 6 when a gain of the signal generation unit 2 is set to zero and the attenuation amount of the variable attenuators 40, 42, and 44 is set to zero, as the step error value at zero attenuation amount.

The control unit 7 sets a measurement value of the measurement unit 6 when the gain of the signal generation unit 2 is set to −1 dB and the attenuation amount of the target variable attenuator is set to zero, as the first reference value.

The control unit 7 causes the measurement unit 6 to measure a measurement value when the gain of the signal generation unit 2 is set to zero and the attenuation amount of a target variable attenuator is set to 1 dB, which is obtained by adding the variation amount to the attenuation amount at a time of the previous measurement.

The control unit 7 set a value obtained by adding the step error value at zero attenuation amount and a value obtained by subtracting the current measurement value from the first reference value to a step error value at the attenuation amount of 1 dB, which is the next step.

The control unit 7 sets a measurement value of the measurement unit 6 when the gain of the signal generation unit 2 is set to 1 dB and the attenuation amount of the target variable attenuator is set to 2 dB, which is obtained by adding the variation amount to the attenuation amount at a time of the previous measurement, as a second reference value.

The control unit 7 sets a value obtained by subtracting the second reference value from the previous measurement value, as a second error value, and sets a value obtained by adding the second error value and a value of the step error at the attenuation amount of 1 dB of the previous step, as a step error value at the attenuation amount of 2 dB, which is the next step.

The control unit 7 sets a measurement value of the measurement unit 6 when the gain of the signal generation unit 2 is set to −1 dB and the attenuation amount of a target variable attenuator is set to 2 dB, which is the attenuation amount at a time of the previous measurement, as a first reference value.

The control unit 7 causes the measurement unit 6 to measure a measurement value when the gain of the signal generation unit 2 is set to zero and the attenuation amount of a target variable attenuator is set to 3 dB, which is obtained by adding the variation amount to the attenuation amount at a time of the previous measurement.

The control unit 7 set a value obtained by adding the step error value at the attenuation amount of 2 dB and a value obtained by subtracting the current measurement value from the first reference value to a step error value at the attenuation amount of 3 dB, which is the next step.

The control unit 7 sets a measurement value of the measurement unit 6 when the gain of the signal generation unit 2 is set to 1 dB and the attenuation amount of the target variable attenuator is set to 4 dB, which is obtained by adding the variation amount to the attenuation amount at a time of the previous measurement, as a second reference value.

The control unit 7 sets a value obtained by subtracting the second reference value from the previous measurement value, as a second error value, and sets a value obtained by adding the second error value and a step error value at the attenuation amount of 3 dB of the previous step, as a step error value at 4 dB attenuation amount, which is the next step.

The control unit 7 repeats such a process to set a measurement value of the measurement unit 6 when the gain of the signal generation unit 2 is set to −1 dB and the attenuation amount of a target variable attenuator is set to 28 dB, which is the attenuation amount at a time of the previous measurement, as a first reference value.

The control unit 7 causes the measurement unit 6 to measure a measurement value when the gain of the signal generation unit 2 is set to zero and the attenuation amount of a target variable attenuator is set to 29 dB, which is obtained by adding the variation amount to the attenuation amount at a time of the previous measurement.

The control unit 7 set a value obtained by adding the step error value at the attenuation amount of 28 dB and a value obtained by subtracting the current measurement value from the first reference value to a step error value at 29 dB attenuation amount, which is the next step.

The control unit 7 sets a measurement value of the measurement unit 6 when the gain of the signal generation unit 2 is set to 1 dB and the attenuation amount of the target variable attenuator is set to 30 dB, which is obtained by adding the variation amount to the attenuation amount at a time of the previous measurement, as a second reference value.

The control unit 7 sets a value obtained by subtracting the second reference value from the previous measurement value, as a second error value, and sets a value obtained by adding the second error value and a step error value at the attenuation amount of 29 dB of the previous step, as a step error value at 30 dB attenuation amount, which is the next step, to calculate a step error value up to 30 dB.

The control unit 7 sets the External path through which a signal generated by the signal generation unit 2 and level-adjusted by the RF module 4 is output from the output terminal 10, acquires a measurement value from an external measurement apparatus connected to the output terminal 10, and calculates a step error value by changing the attenuation amount of the variable attenuator 46.

The control unit 7 sets a measurement value of the measurement unit 6 when the gain of the signal generation unit 2 is set to zero and the attenuation amount of the variable attenuator 46 is set to zero, as the step error value at zero attenuation amount (second initial step error calculation process).

The control unit 7 sets, for example, a value obtained by subtracting the variation amount from the measurement value at the time of the previous measurement, as a reference value (third reference value). The control unit 7 sets a value obtained by subtracting a measurement value of the measurement apparatus when the attenuation amount of the variable attenuator 46 is set to an attenuation amount obtained by adding the variation amount to the attenuation amount at the time of the previous measurement from the reference value, as an error value (third error value).

The control unit 7 sets a value obtained by adding the error value (third error value) and the step error value of the previous step, as a step error value of the next step.

Next, the control unit 7 sets a value obtained by subtracting 1 from the measurement value at the time of the previous measurement as a reference value, repeats these processes, and calculates the step error value at each step (third step error calculation process).

The control unit 7 sets a sum of the step error value of the variable attenuators 40, 42, and 44 and the step error value of the variable attenuator 46 obtained in this manner at each step, as a step error value for each step of the signal generation apparatus 1 as a whole.

Figure 3:
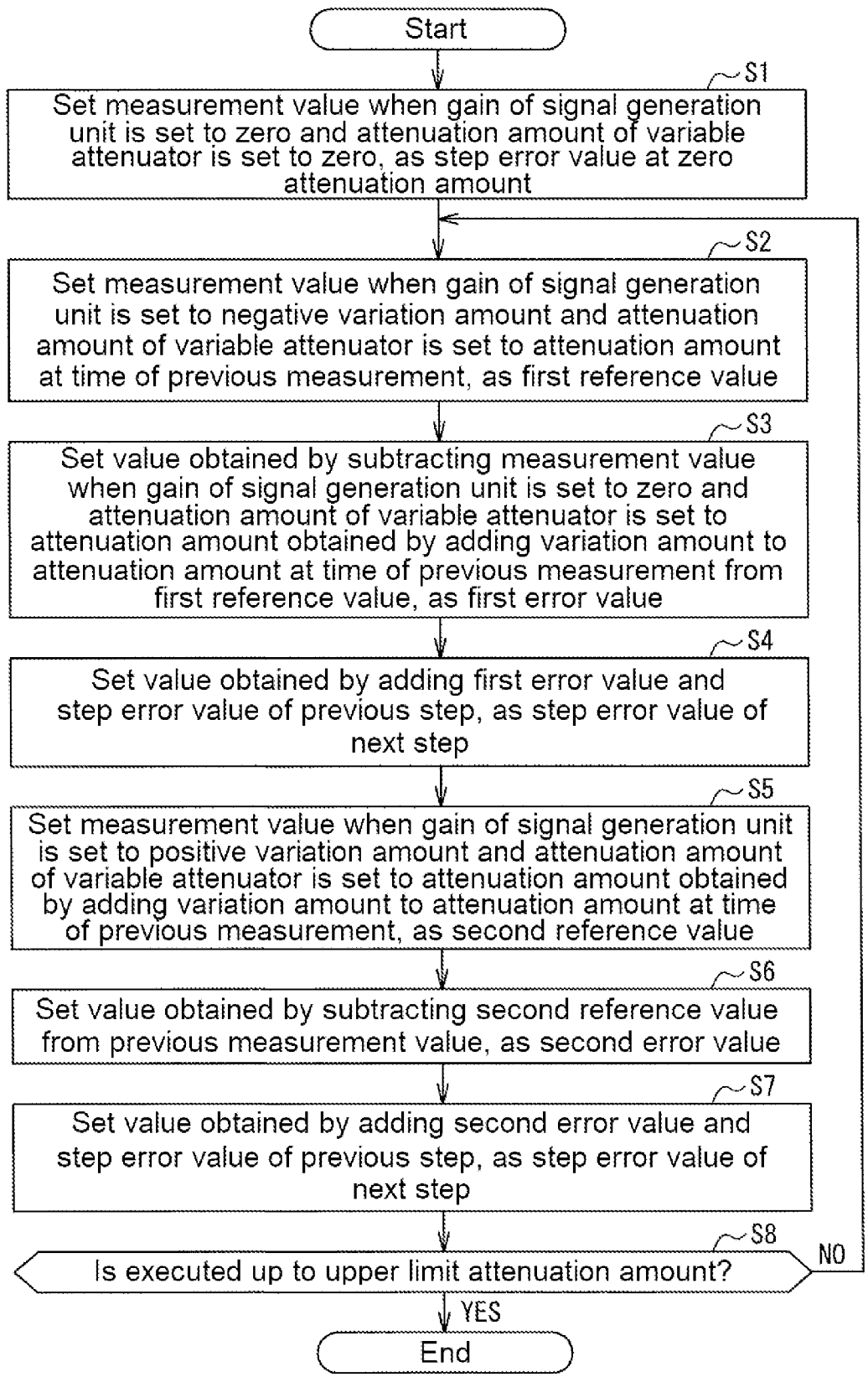
FIG. 3 is a flowchart explaining a procedure of a step error calculation process of an Internal path of the signal generation apparatus according to the embodiment of the present invention.

The step error calculation process with the Internal path by the signal generation apparatus 1 according to the present embodiment configured as described above will be described with reference to FIG. 3. The step error calculation process with the Internal path described below is started when step error calculation with the Internal path is selected by an operation on an input device of the control unit 7.

In step S1, the control unit 7 sets a measurement value of the measurement unit 6 when the gain of the signal generation unit 2 is set to zero and the attenuation amount of the variable attenuators 40, 42, and 44 is set to zero, as a step error value at zero attenuation amount (first initial step error calculation step). After executing the process in step S1, the control unit 7 executes the process in step S2.

In step S2, the control unit 7 sets a measurement value of the measurement unit 6 when the gain of the signal generation unit 2 is set to a negative variation amount and the attenuation amount of the variable attenuators 40, 42, and 44 is set to the attenuation amount at a time of the previous measurement, as a first reference value. After executing the process in step S2, the control unit 7 executes the process in step S3.

In step S3, the control unit 7 sets a value obtained by subtracting a measurement value of the measurement unit 6 when the gain of the signal generation unit 2 is set to zero and the attenuation amount of the variable attenuators 40, 42, and 44 is set to an attenuation amount obtained by adding the variation amount to the attenuation amount at a time of the previous measurement from the first reference value, as a first error value. After executing the process in step S3, the control unit executes the process in step S4.

In step S4, the control unit 7 sets a value obtained by adding the first error value and the step error value of the previous step, as the step error value of the next step. After executing the process in step S4, the control unit 7 executes the process in step S5. The processes from step S2 to step S4 are defined as a first step error calculation step.

In step S5, the control unit 7 sets a measurement value of the measurement unit 6 when the gain of the signal generation unit 2 is set to a positive variation amount and the attenuation amount of the variable attenuators 40, 42, and 44 is set to an attenuation amount obtained by adding the variation amount to the attenuation amount at a time of the previous measurement, as a second reference value. After executing the process in step S5, the control unit 7 executes the process in step S6.

In step S6, the control unit 7 sets a value obtained by subtracting the second reference value from the previous measurement value, as the second error value. After executing the process in step S6, the control unit 7 executes the process in step S7.

In step S7, the control unit 7 sets a value obtained by adding the second error value and the step error value of the previous step, as the step error value of the next step. After executing the process in step S7, the control unit 7 executes the process in step S8. The processes from step S5 to step S7 are defined as a second step error calculation step.

In step S8, the control unit 7 determines whether or not the calculation of the step error value is executed up to an upper limit attenuation amount of the variable attenuators 40, 42, and 44.

In a case where it is determined that the calculation of the step error value is executed up to the upper limit attenuation amount, the control unit 7 ends the step error calculation process with the Internal path. In a case where it is determined that the step error value is not calculated up to the upper limit attenuation amount, the control unit 7 executes the process in step S2.

Figure 4:
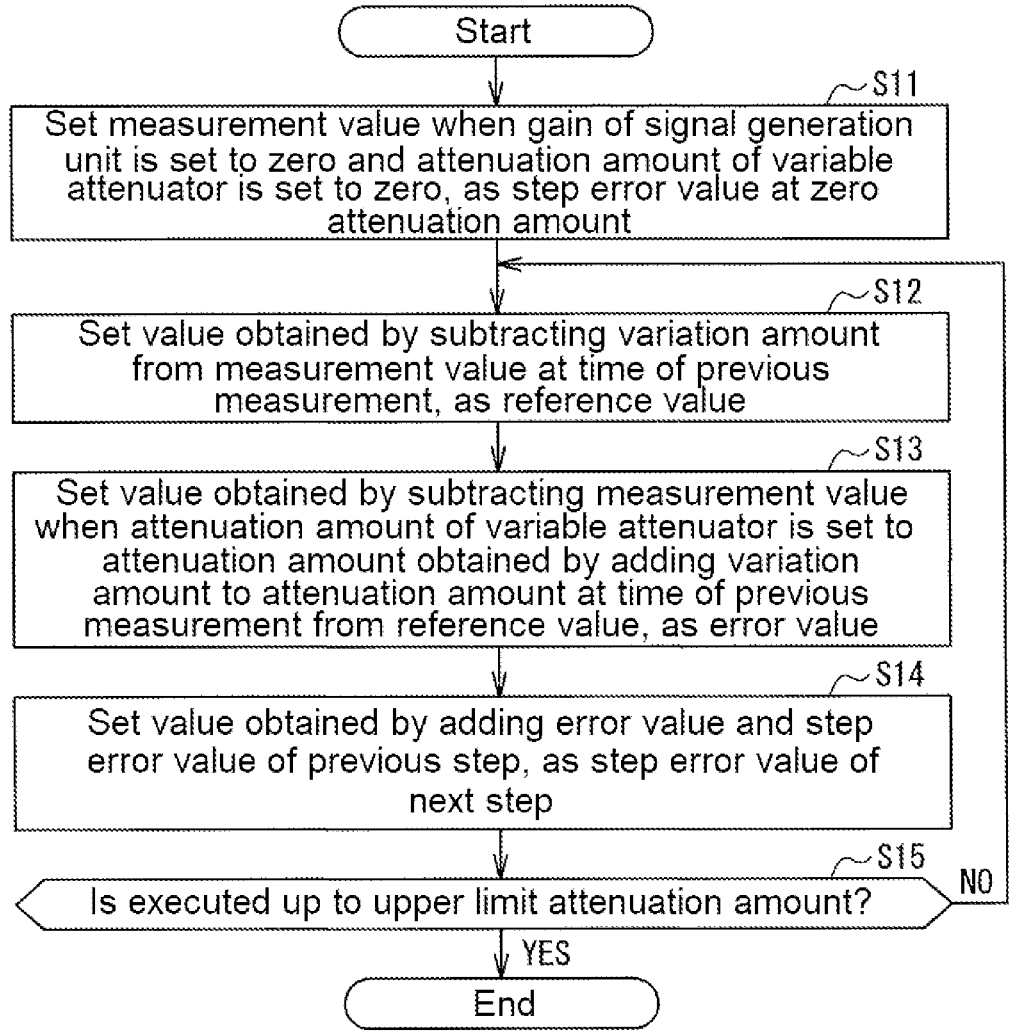
FIG. 4 is a flowchart explaining a procedure of a step error calculation process of an External path of the signal generation apparatus according to the embodiment of the present invention.

Next, the step error calculation process with the External path by the signal generation apparatus 1 according to the present embodiment will be described with reference to FIG. 4. The step error calculation process with the External path described below is started when step error calculation with the External path is selected by an operation on an input device of the control unit 7.

In step S11, the control unit 7 sets a measurement value of the measurement apparatus when the gain of the signal generation unit 2 is set to zero and the attenuation amount of the variable attenuator 46 is set to zero, as a step error value at zero attenuation amount (second initial step error calculation step). After executing the process in step S11, the control unit 7 executes the process in step S12.

In step S12, the control unit 7 sets a value obtained by subtracting the variation amount from the measurement value at the time of the previous measurement, as a reference value (third reference value). After executing the process in step S12, the control unit 7 executes the process in step S13.

In step S13, the control unit 7 sets a value obtained by subtracting a measurement value of the measurement apparatus when the attenuation amount of the variable attenuator 46 is set to an attenuation amount obtained by adding the variation amount to the attenuation amount at the time of the previous measurement from the reference value (third reference value), as an error value (third error value). After executing the process in step S13, the control unit 7 executes the process in step S14.

In step S14, the control unit 7 sets a value obtained by adding the error value (third error value) and the step error value of the previous step, as the step error value of the next step. After executing the process in step S14, the control unit 7 executes the process in step S15. The processes from step S12 to step S14 are defined as a third step error calculation step.

In step S15, the control unit 7 determines whether or not the calculation of the step error value is executed up to an upper limit attenuation amount of the variable attenuator 46.

In a case where it is determined that the calculation of the step error value is executed up to the upper limit attenuation amount, the control unit 7 ends the step error calculation process with the External path. In a case where it is determined that the step error value is not calculated up to the upper limit attenuation amount, the control unit 7 executes the process in step S12.

In this manner, with the embodiment described above, the control unit 7 calculates the step error value of the variable attenuators 40, 42, and 44, which are less affected by a change in impedance due to switching of the switch 48, with the Internal path, and calculates the step error value of the variable attenuator 46, which is greatly affected by the change in impedance due to switching of the switch 48, with the External path.

Therefore, the correction value of the variable attenuators 40, 42, 44, and 46 with high accuracy can be obtained by suppressing the influence of the change in impedance due to switching of the switch 48 and an influence of non-linearity of a semiconductor component on a path from the signal generation unit 2 to the measurement unit 6.

Further, in calculating a step error value with the Internal path, the control unit 7 divides the attenuation amount of the variable attenuators 40, 42, and 44 by the variation amount, which is a predetermined attenuation amount, and sets a measurement value of the measurement unit 6 when the gain of the signal generation unit 2 is set to zero and the attenuation amount of the variable attenuators 40, 42, and 44 is set to zero as the step error value at zero attenuation amount, sets a measurement value of the measurement unit 6 when the gain of the signal generation unit 2 is set to the negative variation amount and the attenuation amount of the variable attenuators 40, 42, and 44 is the attenuation amount at a time of the previous measurement as the first reference value, sets a value of subtracting a measurement value of the measurement unit 6 when the gain of the signal generation unit 2 is set to zero and the attenuation amount of the variable attenuators 40, 42, and 44 is set to an attenuation amount obtained by adding the variation amount to the attenuation amount at the time of the previous measurement from the first reference value as the first error value, sets a value obtained by adding the first error value and the step error value of the previous step as the step error value of the next step, sets a measurement value of the measurement unit 6 when the gain of the signal generation unit 2 is set to the positive variation amount and the attenuation amount of the variable attenuators 40, 42, and 44 is set to an attenuation amount obtained by adding the variation amount to the attenuation amount at the time of the previous measurement as the second reference value, sets a value obtained by subtracting the second reference value from the previous measurement value as the second error value, sets a value obtained by adding the second error value and the step error value of the previous step as the step error value of the next step, and repeats these processes.

Therefore, the correction value of the variable attenuators 40, 42, and 44 with high accuracy can be obtained by calculating the correction value of the variable attenuators 40, 42, and 44 for each predetermined variation amount and suppressing an influence of non-linearity of a semiconductor component on a path from the signal generation unit 2 to the measurement unit 6.

In addition, in calculating the step error value with the External path, the control unit 7 divides the attenuation amount of the variable attenuator 46 by the variation amount, which is a predetermined attenuation amount, sets a measurement value when the gain of the signal generation unit 2 is set to zero the attenuation amount of the variable attenuator 46 is set to zero as the step error value at zero attenuation amount, sets a value obtained by subtracting the variation amount from the measurement value at the time of the previous measurement as the reference value (third reference value), sets a value obtained by subtracting a measurement value when the attenuation amount of the variable attenuator 46 is set to an attenuation amount obtained by adding the variation amount to the attenuation amount at the time of the previous measurement from the reference value (third reference value) as the error value (third error value), sets a value obtained by adding the error value (third error value) and the step error value of the previous step as the step error value of the next step, and repeats this process.

Therefore, the correction value of the variable attenuator 46 with high accuracy can be obtained by calculating the correction value of the variable attenuator 46 for each predetermined variation amount and suppressing an influence of non-linearity of a semiconductor component on a path from the signal generation unit 2 to the output terminal 10.

Although the embodiment of the present invention is disclosed, it is apparent that the embodiment can be modified by those skilled in the art without departing from the scope of the present invention. All such modifications and equivalents are intended to be included in the following claims.

DESCRIPTION OF REFERENCE NUMERALS AND SIGNS

1: Signal generation apparatus
2: Signal generation unit
3: DA converter
4: RF module
5: AD converter
6: Measurement unit
7: Control unit
40, 42, 44: Variable attenuator (first variable attenuator)
46: Variable attenuator (second variable attenuator)

What is claimed is:

1. A signal generation apparatus comprising:
a signal generation unit that generates a predetermined digital signal;
a DA converter that converts the digital signal generated by the signal generation unit into an analog signal of a predetermined radio frequency;
a plurality of variable attenuators that attenuate the analog signal converted by the DA converter;
a measurement unit that detects a level of the signal attenuated by the variable attenuator and passed through one or more semiconductor components;
a switch that switches between an Internal path through which the signal attenuated by the variable attenuator is transmitted to the measurement unit and an External path through which the signal attenuated by the variable attenuator is output from an output terminal; and
a control unit that obtains a value of a step error, which is a correction value of an attenuation amount of the variable attenuator in each of a plurality of steps obtained by dividing a maximum value of the attenuation amount of the variable attenuator by a variation amount, which is a predetermined attenuation amount,
wherein the control unit calculates the value of the step error of a first variable attenuator, which is less affected by a change in impedance due to switching of the switch, among the plurality of variable attenuators, with the Internal path, and calculates the value of the step error of a second variable attenuator of the plurality of variable attenuators, which is greatly affected by the change in impedance due to switching of the switch, with the External path.

2. The signal generation apparatus according to claim 1, wherein the control unit calculates the value of the step error with the Internal path, which is a correction value of the first variable attenuator, by performing a first initial step error calculation process at first, and then repeatedly performing a first step error calculation process and a second step error calculation process alternately, the first initial step error calculation process is a process of setting a measurement value of the measurement unit when a gain of the signal generation unit is set to zero and an attenuation amount of the first variable attenuator is set to zero, as the value of the step error at zero attenuation amount, the first step error calculation process is a process of
setting a measurement value of the measurement unit when the gain of the signal generation unit is set to a negative variation amount and the attenuation amount of the first variable attenuator is set to the attenuation amount at a time of the previous measurement, as a first reference value,
setting a value obtained by subtracting a measurement value of the measurement unit when the gain of the signal generation unit is set to zero and the attenuation amount of the first variable attenuator is set to an attenuation amount obtained by adding the variation amount to the attenuation amount at the time of the previous measurement from the first reference value, as a first error value, and
setting a value obtained by adding the first error value and the value of the step error of the previous step, as the value of the step error of the next step, and the second step error calculation process is a process of
setting a measurement value of the measurement unit when the gain of the signal generation unit is set to a positive variation amount and the attenuation amount of the first variable attenuator is set to an attenuation amount obtained by adding the variation amount to the attenuation amount at the time of the previous measurement, as a second reference value,
setting a value obtained by subtracting the second reference value from the previous measurement value, as a second error value, and
setting a value obtained by adding the second error value and the value of the step error of the previous step, as the value of the step error of the next step.

3. The signal generation apparatus according to claim 2, wherein the control unit calculates the value of the step error with the External path, which is a correction value of the second variable attenuator, by performing a second initial step error calculation process at first, and then repeatedly performing a third step error calculation process, the second initial step error calculation process is a process of setting a measurement value when the gain of the signal generation unit is set to zero and an attenuation amount of the second variable attenuator is set to zero, as the value of the step error at zero attenuation amount, and the third step error calculation process is a process of
setting a value obtained by subtracting the variation amount from the measurement value at the time of the previous measurement, as a third reference value,
setting a value obtained by subtracting a measurement value when the attenuation amount of the second variable attenuator is set to an attenuation amount obtained by adding the variation amount to the attenuation amount at the time of the previous measurement from the third reference value, as a third error value, and
setting a value obtained by adding the third error value and the value of the step error of the previous step, as the value of the step error of the next step.

4. The signal generation apparatus according to claim 1, wherein the control unit calculates the value of the step error with the External path, which is a correction value of the second variable attenuator, by performing a second initial step error calculation process at first, and then repeatedly performing a third step error calculation process, the second initial step error calculation process is a process of setting a measurement value when a gain of the signal generation unit is set to zero and an attenuation amount of the second variable attenuator is set to zero, as the value of the step error at zero attenuation amount, and the third step error calculation process is a process of
setting a value obtained by subtracting the variation amount from the measurement value at a time of the previous measurement, as a third reference value,
setting a value obtained by subtracting a measurement value when the attenuation amount of the second variable attenuator is set to an attenuation amount obtained by adding the variation amount to the attenuation amount at the time of the previous measurement from the third reference value, as a third error value, and
setting a value obtained by adding the third error value and the value of the step error of the previous step, as the value of the step error of the next step.

5. A level correction value calculation system comprising:
a signal generation apparatus including
a signal generation unit that generates a predetermined digital signal,
a DA converter that converts the digital signal generated by the signal generation unit into an analog signal of a predetermined radio frequency,
a plurality of variable attenuators that attenuate the analog signal converted by the DA converter,
a measurement unit that detects a level of the signal attenuated by the variable attenuator and passed through one or more semiconductor components,
a switch that switches between an Internal path through which the signal attenuated by the variable attenuator is transmitted to the measurement unit and an External path through which the signal attenuated by the variable attenuator is output from an output terminal, and
a control unit that obtains a value of a step error, which is a correction value of an attenuation amount of the variable attenuator in each of a plurality of steps obtained by dividing a maximum value of the attenuation amount of the variable attenuator by a variation amount, which is a predetermined attenuation amount,
the control unit calculating the value of the step error of a first variable attenuator, which is less affected by a change in impedance due to switching of the switch, among the plurality of variable attenuators, with the Internal path, and calculating the value of the step error of a second variable attenuator of the plurality of variable attenuators, which is greatly affected by the change in impedance due to switching of the switch, with the External path; and
a measurement apparatus that detects a level of the signal output from the signal generation apparatus and transmits the level to the control unit.

6. A level correction value calculation method of a signal generation apparatus including
   a signal generation unit that generates a predetermined digital signal,
   a DA converter that converts the digital signal generated by the signal generation unit into an analog signal of a predetermined radio frequency,
   a plurality of variable attenuators that attenuate the analog signal converted by the DA converter,
   a measurement unit that detects a level of the signal attenuated by the variable attenuator and passed through one or more semiconductor components,
   a switch that switches between an Internal path through which the signal attenuated by the variable attenuator is transmitted to the measurement unit and an External path through which the signal attenuated by the variable attenuator is output from an output terminal, and
   a control unit that obtains a value of a step error, which is a correction value of an attenuation amount of the variable attenuator in each of a plurality of steps obtained by dividing a maximum value of the attenuation amount of the variable attenuator by a variation amount, which is a predetermined attenuation amount, the method comprising:
   calculating the value of the step error of a first variable attenuator, which is less affected by a change in impedance due to switching of the switch, among the plurality of variable attenuators, with the Internal path; and
   calculating the value of the step error of a second variable attenuator of the plurality of variable attenuators, which is greatly affected by the change in impedance due to switching of the switch, with the External path.

7. The level correction value calculation method according to claim 6,
   wherein the calculating with the Internal path includes
      calculating a correction value of the first variable attenuator by performing a first initial step error calculation step at first, and then repeatedly performing a first step error calculation step and a second step error calculation step alternately,
   the first initial step error calculation step is a step of setting a measurement value of the measurement unit when a gain of the signal generation unit is set to zero and an attenuation amount of the first variable attenuator is set to zero, as the value of the step error at zero attenuation amount,
   the first step error calculation step includes
      a step of setting a measurement value of the measurement unit when the gain of the signal generation unit is set to a negative variation amount and the attenuation amount of the first variable attenuator is set to the attenuation amount at a time of the previous measurement, as a first reference value,
      a step of setting a value obtained by subtracting a measurement value of the measurement unit when the gain of the signal generation unit is set to zero and the attenuation amount of the first variable attenuator is set to an attenuation amount obtained by adding the variation amount to the attenuation amount at the time of the previous measurement from the first reference value, as a first error value, and
      a step of setting a value obtained by adding the first error value and the value of the step error of the previous step, as the value of the step error of the next step, and
   the second step error calculation step includes
      a step of setting a measurement value of the measurement unit when the gain of the signal generation unit is set to a positive variation amount and the attenuation amount of the first variable attenuator is set to an attenuation amount obtained by adding the variation amount to the attenuation amount at the time of the previous measurement, as a second reference value,
      a step of setting a value obtained by subtracting the second reference value from the previous measurement value, as a second error value, and
      a step of setting a value obtained by adding the second error value and the value of the step error of the previous step, as the value of the step error of the next step.

8. The level correction value calculation method according to claim 6,
   wherein the calculating with the External path includes
      calculating a correction value of the second variable attenuator by performing a second initial step error calculation step at first, and then repeatedly performing a third step error calculation step,
   the second initial step error calculation step is a step of setting a measurement value when a gain of the signal generation unit is set to zero and an attenuation amount of the second variable attenuator is set to zero, as the value of the step error at zero attenuation amount, and
   the third step error calculation step includes
      a step of setting a value obtained by subtracting the variation amount from the measurement value at a time of the previous measurement, as a third reference value,
      a step of setting a value obtained by subtracting a measurement value when the attenuation amount of the second variable attenuator is set to an attenuation amount obtained by adding the variation amount to the attenuation amount at the time of the previous measurement from the third reference value, as a third error value, and
      a step of setting a value obtained by adding the third error value and the value of the step error of the previous step, as the value of the step error of the next step.

* * * * *